(12) United States Patent
Li et al.

(10) Patent No.: US 8,685,843 B2
(45) Date of Patent: Apr. 1, 2014

(54) DIRECT GROWTH OF GRAPHENE ON SUBSTRATES

(75) Inventors: Lain-Jong Li, Hsin-Chu (TW);
Ching-Yuan Su, Taiping (TW); Ang-Yu Lu, Taichung (TW); Chih-Yu Wu, Taitung (TW); Keng-Ku Liu, Taichung (TW)

(73) Assignee: Academia Sinica, Taipei (TW)

( * ) Notice: Subject to any disclaimer, the term of this patent is extended or adjusted under 35 U.S.C. 154(b) by 0 days.

(21) Appl. No.: 13/346,152

(22) Filed: Jan. 9, 2012

(65) Prior Publication Data

US 2013/0001515 A1 Jan. 3, 2013

(30) Foreign Application Priority Data

Jul. 1, 2011 (CN) .......................... 2011 1 0189082

(51) Int. Cl.
*H01L 21/04* (2006.01)
(52) U.S. Cl.
USPC ...................... 438/479; 257/24; 257/E21.041
(58) Field of Classification Search
USPC .................... 257/E23.099, E23.102; 428/688
See application file for complete search history.

(56) References Cited

U.S. PATENT DOCUMENTS

| | | | | |
|---|---|---|---|---|
| 2010/0173422 A1* | 7/2010 | Koley et al. | .................. | 436/149 |
| 2011/0101309 A1* | 5/2011 | Lin et al. | ......................... | 257/29 |
| 2011/0104442 A1* | 5/2011 | Yoon et al. | .................... | 428/152 |
| 2012/0328906 A1* | 12/2012 | Kwon et al. | ................. | 428/688 |

OTHER PUBLICATIONS

Berger, et al., "Electronic Confinement and Coherence in Patterned Epitaxial Graphene", Science 312:1191-1196, May 26, 2006.
Byun et al., "Graphenes Converted from Polymers", The Journal of Physical Chemistry Letters 2:493-497, 2011.
Coraux et al., "Structural Coherency of Graphene on Ir(111)", Nano Letters 8:565-570, 2008.
Cote, et al., "Langmuir-Blodgett Assembly of Graphite Oxide Single Layers", J. Am. Chem. Soc. 131:1043-1049, 2009.
Emtsev et al., "Interaction, Growth, and Ordering of Epitaxial Graphene on SiC{0001} Surfaces: A Comparative Photoelectron Spectroscopy Study", Physical Review B 77:155303-1 thru 155303-10. 2008.
Ferrari et al., "Raman Spectrum of Graphene and Graphene Layers", Physical Review Letters 97:187401-1 to 18740-4, Nov. 3, 2006.
Gao et al., "New Insights Into the Structure and Reduction of Graphite Oxide", Nature Chemistry 1:403-408, Aug. 2009.
Geim et al., "The Rise of Graphene", Nature Materials 6:183-191, Mar. 2007.
Green et al., "Solution Phase Production of Graphene with Controlled Thickness Via Density Differentiation", Nano Letters 9:4031-4036, 2009.
Hass et al., "The Growth and Morphology of Epitaxial Multilayer Graphene", Journal of Physics: Condensed Matter 20:1-27, 2008.

(Continued)

*Primary Examiner* — Zandra Smith
*Assistant Examiner* — Paul Patton
(74) *Attorney, Agent, or Firm* — Fish & Richardson P.C.

(57) ABSTRACT

Graphene layers can be formed on a dielectric substrate using a process that includes forming a copper thin film on a dielectric substrate; diffusing carbon atoms through the copper thin film; and forming a graphene layer at an interface between the copper thin film and the dielectric substrate.

36 Claims, 19 Drawing Sheets

(56) References Cited

OTHER PUBLICATIONS

Hernandez et al., "High-Yield Production of Graphene by Liquid-phase Exfoliation of Graphite", Nature Nanotechnology 3:563-568, Sep. 2008.
Kim et al., "Large-scale Pattern Growth of Graphene Films for Stretchable Transparent Electrodes", Nature 457:706-710, Feb. 2009.
Lee et al., "Toward High-Performance Solution-Processed Carbon Nanotube Network Transistors by Removing Nanotube Bundles", The Journal of Physical Chemistry 112:12089-12091, 2008.
Lee et al., "Wafer Scale Homogeneous Bilayer Graphene Films by Chemical Vapor Deposition", Nano Letters 10:4702-4707, 2010.
Lee et al., "Wafer-Scale Synthesis and Transfer of Graphene Films", Nano Letters 10:490-493, 2010.
Li et al., "Large-Area Synthesis of High-Quality and Uniform Graphene Films on Copper Foils", Science 324:1312-1314, Jun. 5, 2009.
Li et al., "Processable Aqueous Dispersions of Graphene Nanosheets", Nature Nanotechnology 3:101-105, Feb. 2008.
Li et al., "Low-Temperature Growth of Graphene Chemical Vapor Deposition Using Solid and Liquid Carbon Sources," ACSNano, vol. 5, No. 4, pp. 3385-3390, 2011.
Lin et al., "100-GHz Transistors from Wafer-Scale Epitaxial Graphene", Science 327:662, Feb. 5, 2010.
Nair et al., "Fine Structure Constant Defines Visual Transparency of Graphene", Science 320:1308, Jun. 6, 2008.
Neto et al., "The Electronic Properties of Graphene", Reviews of Modern Physics 81:109-162, Jan.-Mar. 2009.
Reina et al., "Large Area, Few-Layer Graphene Films on Arbitrary Substrates by Chemical Vapor Deposition", Nano Letters 9:30-35, 2009.
Schwierz, "Graphene Transistors", Nature Nanotechnology 5:487-496, Jul. 2010.
Su et al., "Highly Efficient Restoration of Graphitic Structure in Graphene Oxide Using Alcohol Vapors", ACS Nano 4:5285-5292, 2010.
Su et al., "High-Quality Thin Graphene Films from Fast Electrochemical Exfoliation", ACS Nano 5:2332-2339, 2011.
Sukang et al., "Roll-to-Roll Production of 30-inch Graphene Films for Transparent Electrodes," Nature Nanotechnology, vol. 5, DOI: 10.1038/NNano.2010.132, pp. 574-578, Aug. 2010.
Sun et al., "Growth of Graphene From Solid Carbon Sources", Nature 468:549-552, Nov. 25, 2010 and Corrections and Amendments, Nature 471:124, Mar. 3, 2011.
Sutter et al., "Epitaxial Graphene on Ruthenium", Nature Materials 7:406-411, May 2008.
Williams et al., "$TiO_2$-Graphene Nanocomposites. UV-Assisted Photocatalytic Reduction of Graphene Oxide", ACS Nano 2:1487-1491, 2008.
Wilson et al., "Carbon Nanotube Tips for Atomic Force Microscopy", Nature Nanotechnology 4:483-491, Aug. 2009.
Yan et al., "Formation of Bilayer Bernal Graphene: Layer-by-Layer Epitaxy via Chemical Vapor Deposition", Nano Letters 11:1106-1110, 2011.

\* cited by examiner

| Peak Area | Amplitide | Peak position (cm⁻¹) | Peak band-width (cm⁻¹) |
|---|---|---|---|
| 1  3.039e+04 | 686.57718 | 2719.8603 | 28.178731 |
| 2  1.438e+04 | 319.55109 | 2704.7337 | 28.656278 |
| 3  3.003e+04 | 674.49664 | 2741.4172 | 28.343313 |
| 4  1.569e+04 | 354.36242 | 2760.5788 | 28.183636 |

DIRECT GROWTH OF GRAPHENE ON SUBSTRATES

CROSS REFERENCE TO RELATED APPLICATIONS

This application claims priority to Chinese application 201110189082.5, filed on Jul. 1, 2011, which is incorporated herein by reference.

TECHNICAL FIELD

The present disclosure relates generally to direct growth of graphene on substrates.

BACKGROUND

A graphene layer is a one-atom-thick planar sheet of carbon atoms that are tightly packed in a two-dimensional honeycomb lattice. Graphene has a high electron mobility at room temperature. Graphene films can be produced in a number of ways, including mechanical and liquid phase exfoliation from graphite, epitaxial growth on crystalline substrate, and reduction from graphene oxides. Chemical vapor deposition (CVD) can be used to produce graphene layers on catalytic metal substrates, and the graphene layers can be transferred to other desired substrates. For example, a graphene layer can be formed on a metal substrate, and transferred from the metal substrate to a destination substrate (e.g., a semiconductor wafer) using a wet-transfer process. The wet-transfer process involves protecting the graphene layer with a supporting polymer layer, etching and removing the metal substrate, transferring the graphene layer to the destination substrate, and removing the polymer layer from the graphene layer.

SUMMARY

In one aspect, in general, a method for forming graphene layers on a dielectric substrate is provided. The method includes forming a copper thin film on a dielectric substrate; diffusing carbon atoms through the copper thin film; and forming a graphene layer at an interface between the copper thin film and the dielectric substrate.

Implementations of the method may include one or more of the following features. The copper thin film can be formed using sputtering, thermal evaporation, or electrochemical deposition. The copper thin film can have a thickness in a range from about 10 nm to about 1 μm, or from about 100 nm to about 300 nm. The method can include depositing a precursor material having carbon atoms on the surface of the copper thin film using chemical vapor deposition. The chemical vapor deposition can be performed at a temperature in a range from about 300° C. to about 1050° C., or from about 800° C. to about 900° C. The chemical vapor deposition can be performed in a hydrogen atmosphere. The precursor material can include methane, ethylene, acetylene, ethanol, benzene, methanol, carbon-based polymer, a nano-carbon material, or a combination of two or more of the above materials. The dielectric substrate can include a silicon substrate, a quartz substrate, a glass substrate, a sapphire substrate, or a boron nitride substrate. The method can include depositing a precursor material having carbon atoms on the surface of the copper thin film using physical vapor deposition, atomic layer deposition, epitaxial growth method, or molecular beam epitaxy method. The copper thin film can be removed to expose the graphene layer. The copper thin film can be removed using chemical etching, electrochemical etching, or mechanical removal. The copper thin film can be removed using an etching solution containing $Fe(NO_3)_3$. A bi-layer graphene thin film having two sheets of carbon atoms can be formed. A tri-layer graphene thin film having three sheets of carbon atoms can be formed. The substrate and the copper thin film can be heated in a hydrogen atmosphere to remove an oxide layer from the copper thin film prior to diffusing the carbon atoms. The method can include patterning the copper thin film, and forming a patterned graphene layer. A transistor can be fabricated based on the patterned graphene layer. A biosensor can be fabricated based on the patterned graphene layer. A graphene thin film having a stacked structure can be formed. The graphene thin film can include A-B stacked bilayer graphene.

In another aspect, in general, a method for forming a thin film of inorganic material on a substrate is provided. The method includes forming a metal thin film on a substrate; diffusing atoms of an inorganic material through the metal thin film; and forming a layer of material at an interface between the metal thin film and the substrate, the layer of material including the atoms of the inorganic material that diffused through the metal thin film.

Implementations of the method may include one or more of the following features. The method can include providing a precursor material and causing the precursor material to dissociate at the metal thin surface to produce the atoms that diffuse through the metal thin film. The metal thin film can include a copper thin film. The substrate can include a dielectric substrate. The atoms of the inorganic material can include carbon, and forming a layer of material at an interface can include forming a graphene layer at the interface. The metal thin film can have a thickness in a range from about 10 nm to about 1 μm.

In another aspect, in general, a method for fabricating a device that includes a graphene layer is provided. The method includes forming a copper thin film on a dielectric substrate; patterning the copper thin film; depositing precursor material on the copper thin film using chemical vapor deposition, the precursor material comprising carbon; diffusing carbon atoms through the patterned copper thin film; forming a patterned graphene layer at an interface between the copper thin film and the dielectric substrate; removing the patterned copper thin film; and forming electrodes on the dielectric substrate in which at least a portion of the graphene layer is disposed between the electrodes.

In another aspect, in general, an apparatus includes a graphene layer on a substrate, in which the graphene layer is produced by a process that includes forming a copper thin film on the dielectric substrate; diffusing carbon atoms through the copper thin film; and forming a graphene layer at an interface between the copper thin film and the substrate.

Implementations of the apparatus may include one or more of the following features. The copper thin film can be formed by sputtering. The copper thin film can have a thickness in a range from about 100 nm to about 300 nm. A precursor material having carbon atoms can be deposited on the surface of the copper thin film using chemical vapor deposition. The chemical vapor deposition can be performed at a temperature in a range from about 800° C. to about 900° C. The precursor material can include methane, ethylene, acetylene, ethanol, benzene, methanol, carbon-based polymer, a nano-carbon material, or a combination of two or more of the above materials. The dielectric substrate can include a silicon substrate, a quartz substrate, a glass substrate, a sapphire substrate, or a boron nitride substrate.

In another aspect, in general, an apparatus includes a substrate; a graphene layer formed on the substrate by diffusing carbon through a metal thin layer on the substrate and removing the metal thin layer; source and drain electrodes, in which at least a portion of the graphene layer is disposed between the source and drain electrodes; and a gate electrode.

Implementations of the apparatus may include one or more of the following features. The substrate can include a silicon substrate, a quartz substrate, a glass substrate, a sapphire substrate, or a boron nitride substrate.

DETAILED DESCRIPTION

Figure 1:
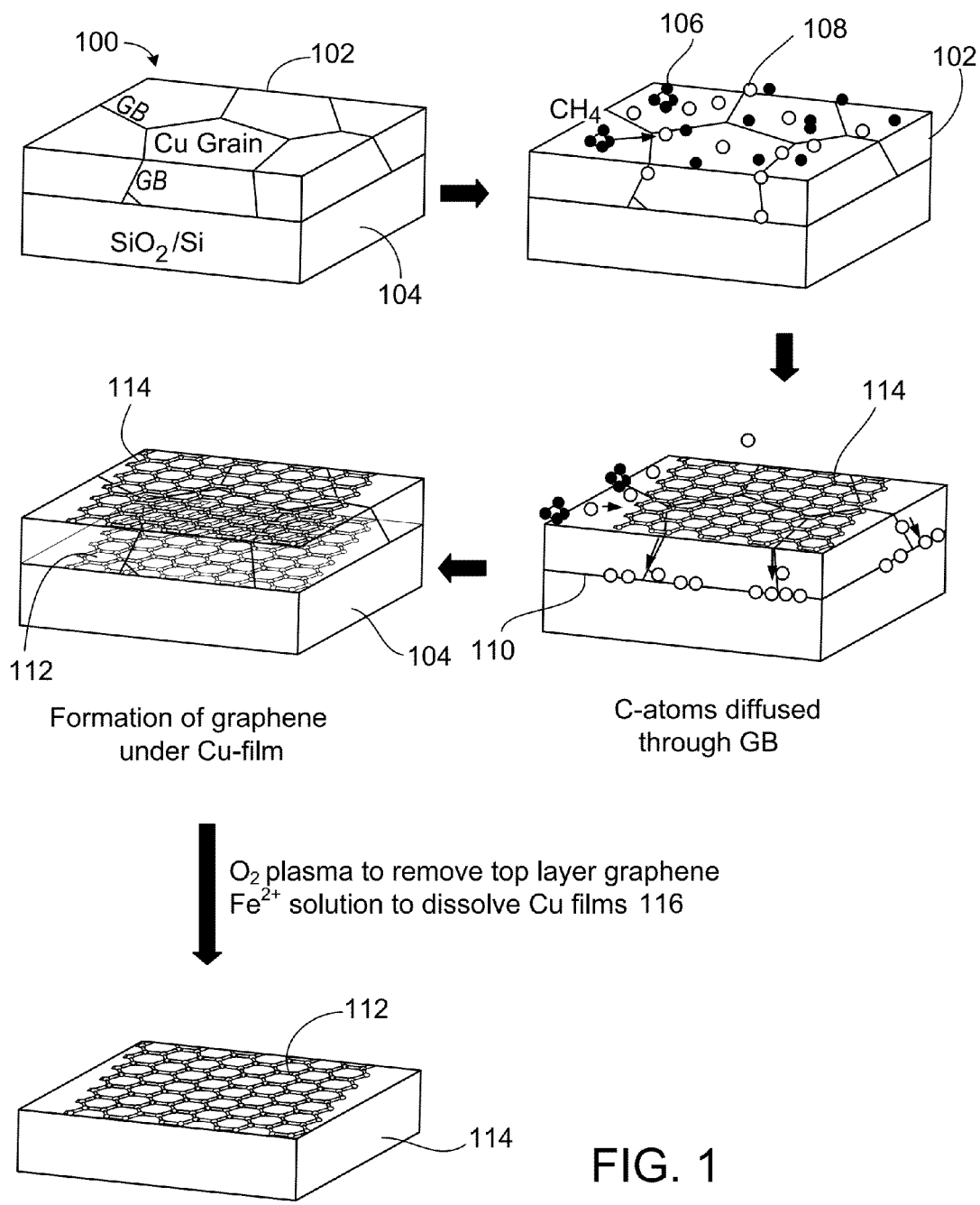
FIG. 1 is a diagram of an example process for fabricating graphene layers.

Referring to FIG. 1, a graphene thin film can be fabricated using an example process 100 that includes forming a metal (e.g., copper) thin film on a substrate, diffusing carbon atoms through the metal thin film, forming a graphene thin film at the interface between the metal thin film and the substrate, and removing the metal thin film. After removal of the metal thin film, the graphene thin film remains on the substrate and can be used to fabricate various devices, such as graphene transistors. An advantage of the process 100 is that the graphene thin film does not need to be transferred to another substrate, there will be no damage caused by a transfer process, so a large-size graphene thin film can be fabricated. Another advantage is that the graphene thin film will not have any polymer residue, which may occur if a transfer process were used in which a polymer layer is used to protect the graphene during the transfer process.

In some implementations of the invention, the process 100 includes the following steps. In the following description, a copper thin film is used as an example, but other types of metal can also be used for the metal thin film. Using sputtering, a copper thin film 102 is formed on a substrate 104. The copper thin film 102 may include grains of copper. The copper thin film 102 can have a thickness of, e.g., about 300 nm. The copper layer serves as a catalyst layer for growing graphene. The substrate 104 can be an insulating substrate, e.g., a quartz substrate, a sapphire substrate, or a silicon substrate having a surface layer of silicon oxide. The silicon oxide layer can have a thickness of, e.g., 300 nm. The substrate 104 and the copper thin film 102 are heated, followed by thermal annealing. For example, the substrate 104 and the copper thin film 102 are placed in a quartz tubular furnace and heated to 750° C. in a hydrogen atmosphere (under gas flow conditions $H_2$: 415 sccm and Ar: 400 sccm at 500 Torr), followed by thermal annealing at 750° C. for 25 minutes.

The substrate and the copper thin film are heated to a predetermined temperature, and a precursor material 106 having carbon is provided. For example, the precursor material is provided using chemical vapor deposition (CVD), and the precursor material is methane ($CH_4$). The furnace is heated from 750° C. to 900° C. in a pure $H_2$ gas environment (e.g., the hydrogen gas flow is 15 sccm, and the atmospheric pressure is 800 mTorr). When the temperature reaches 900° C., the gas flow is switched to a methane/hydrogen gas mixture (e.g., the $CH_4$ gas flow is 75 sccm, and the $H_2$ gas flow is 15 sccm) at 800 mTorr. Methane molecules 106 dissociate on the copper surface to produce carbon atoms 108.

Copper has a very low solubility for carbon. Some of the carbon atoms 108 form continuous graphene layers 114 on the top surface of the copper thin film 102. Some of the carbon atoms 108 diffuse through openings between copper grain boundaries and reach an interface 110 between the copper thin film 102 and the substrate 104.

The carbon atoms 108 aggregate and form one or more graphene layers 112 at the interface 110. Because the graphene layers 112 are formed below the copper thin film 102, the graphene layers 112 are referred to as "bottom layer graphene." The graphene layers 114 formed on the top surface of the copper thin film 102 are referred to as "top layer graphene."

In some examples, the carbon rich environment ($CH_4$=75 sccm and $H_2$=15 sccm at 800 mTorr and 900° C.) is maintained for about 5 minutes to allow the graphene layers to grow. The substrate 104 is subsequently cooled down. For example, the furnace is cooled to room temperature at a cooling rate of about 20° C./min, in which the same gas condition is maintained from the beginning of graphene growth stage to the end of the cooling stage.

The temperature 900° C. is favorable for graphene growth. If the temperature increases to 1000° C., there may be evaporation and dewetting of the copper film. The growth pressure is preferably not less than 800 mTorr, otherwise, the dewetting of copper becomes pronounced due to the fast evaporation of copper. If the graphene layer is grown at 1000° C. in a $H_2$ environment, the quality of the underlying silicon oxide layer may be degraded, resulting in a larger gate leakage current if the silicon oxide is used as a gate dielectric material.

The top layer graphene 114 is removed by, e.g., oxygen plasma (e.g., at 60 W power for 6 minutes). The copper thin film 102 is removed by, e.g., $Fe(NO_3)_3$ wet-etching. This results in large-area and continuous graphene layers on the substrate 104. Because a silicon substrate 104 is used, semiconductor processing that is commonly used to process silicon-based integrated circuits can also be used to process the substrate 104 and the graphene layers 112.

In the process 100, the copper thin film can be replaced by other metal thin films, such as thin films made of nickel, iron, cobalt, nickel, gold, silver, or an alloy of two or more of the above. The thickness of the metal thin film can be, e.g., in a range from about 10 nm to about 1 µm, or in a range from about 100 nm to about 300 nm. The process conditions, such as temperature, gas pressures, and the time period for annealing and graphene growth are provided as examples. Other process conditions can also be used.

Figure 2:
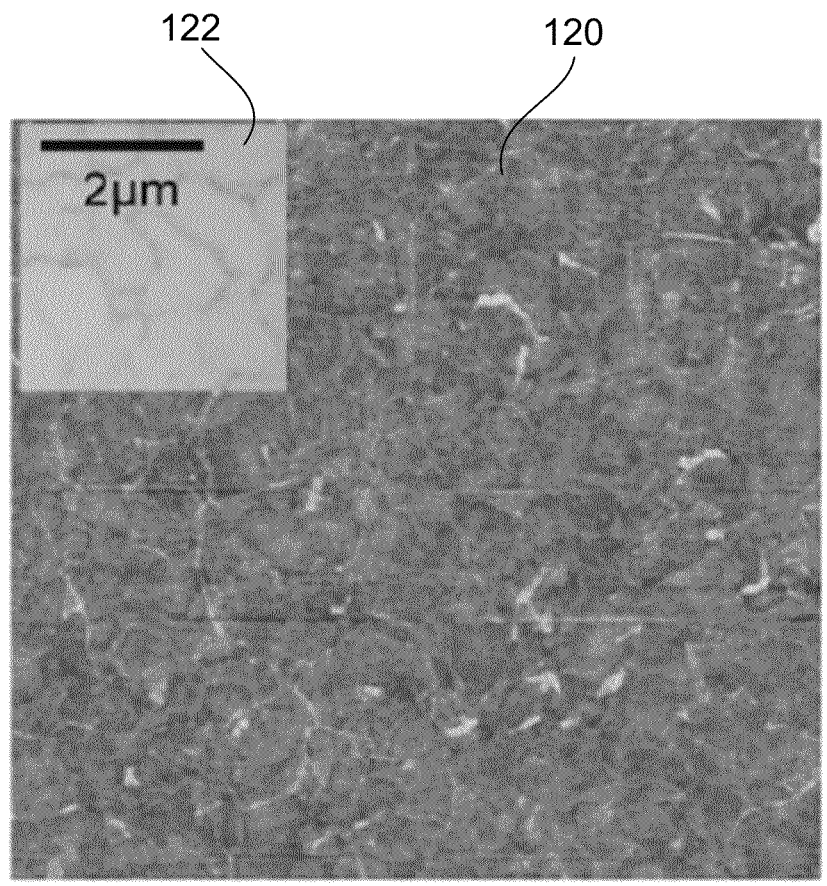
FIG. 2 is an atomic force microscope (AFM) image of an example bottom layer graphene grown on a $SiO_2/Si$ substrate.

FIG. 2 shows an atomic force microscope (AFM) image 120 of the bottom layer graphene grown on a $SiO_2$/Si substrate. The $SiO_2$/Si substrate is covered with graphene layers. When the process parameters described above are used, the large-area, continuous bottom layer graphene includes a few layers of graphene. The growth of bottom layer graphene does not appear to be limited to a single layer. It is possible that the graphene domain boundaries and impurities in the first-grown graphene layer may serve as nucleation sites for the growth of additional graphene layers on top of the first layer. The image 120 shows that the graphene layers have a wrinkle-like structure. An optical micrograph 122 shows that the domain size surrounded by the wrinkles is similar to the copper grain size.

Figure 3:
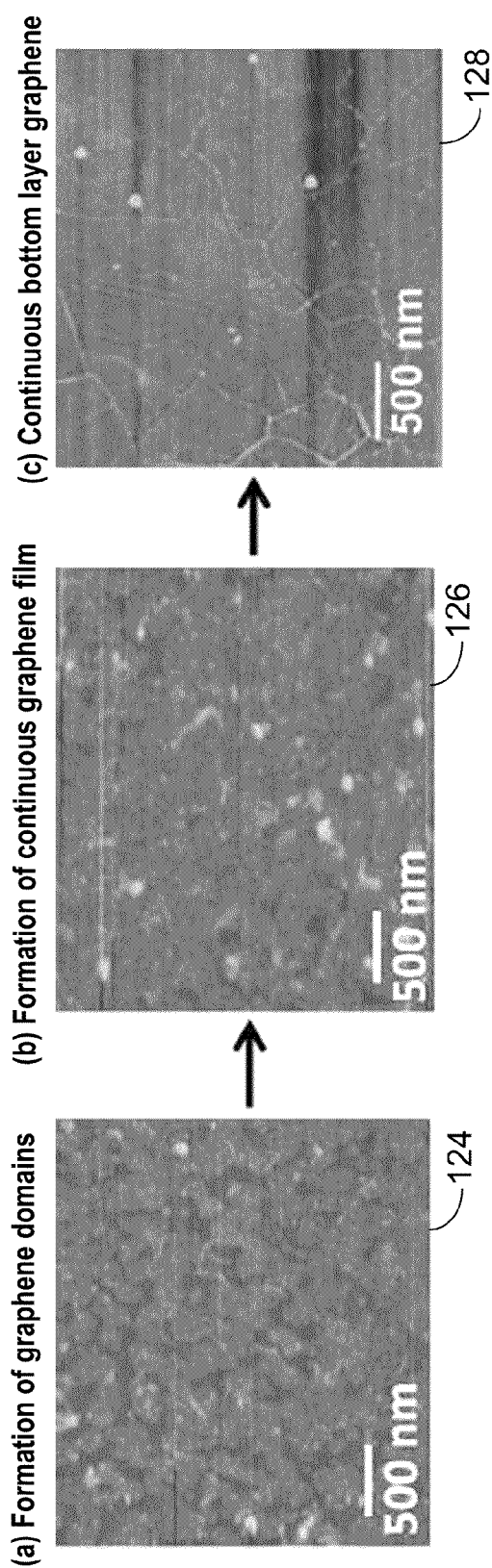
FIG. 3 includes AFM images showing the effect of growth time on the domain size of a bottom layer graphene.

Referring to FIG. 3, images 124, 126, and 128 show the effect of growth time on the size of the bottom layer graphene. The image 124 was taken first, the second image 126 was obtained a period of time after the first image 124, and the third image 128 was taken a period of time after the second image 126. The nucleation process occurs in the beginning, followed by the graphene domain growth. The first image 124 shows the formation of graphene domains. The second image 126 shows formation of a continuous graphene film. The third image 128 shows the continuous bottom layer graphene. It appears that the graphene domains merged into the continuous graphene layers over time.

Figure 4A:
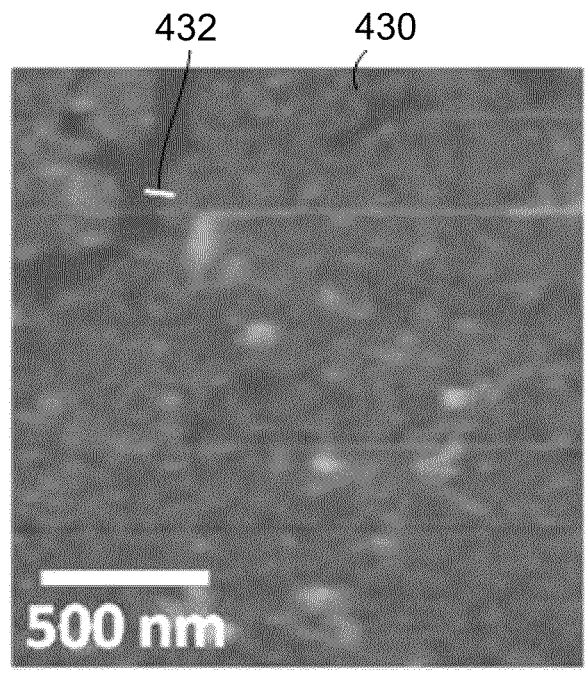
FIG. 4A is an AFM image of bottom layer graphene showing the presence of a crack.
Figure 4B:
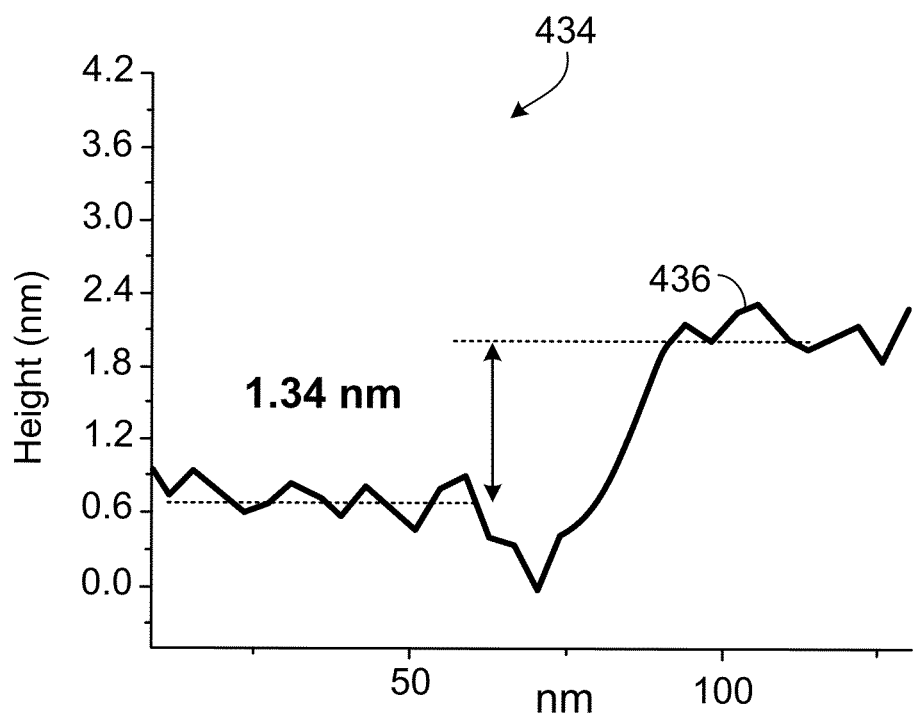
FIG. 4B is a graph showing the height profile of the bottom layer graphene of FIG. 4A.

FIG. 4A is an AFM image 430 of bottom layer graphene showing the presence of a crack 432. FIG. 4B is a graph 434 showing the height profile 436 of the bottom layer graphene of FIG. 4A at the location of the crack 432 obtained based on AFM cross section measurements. The height profile 436 indicates that the graphene film thickness is about 1.34 nm, suggesting that the bottom layer graphene includes about 2 to 3 graphene layers.

Figure 5:
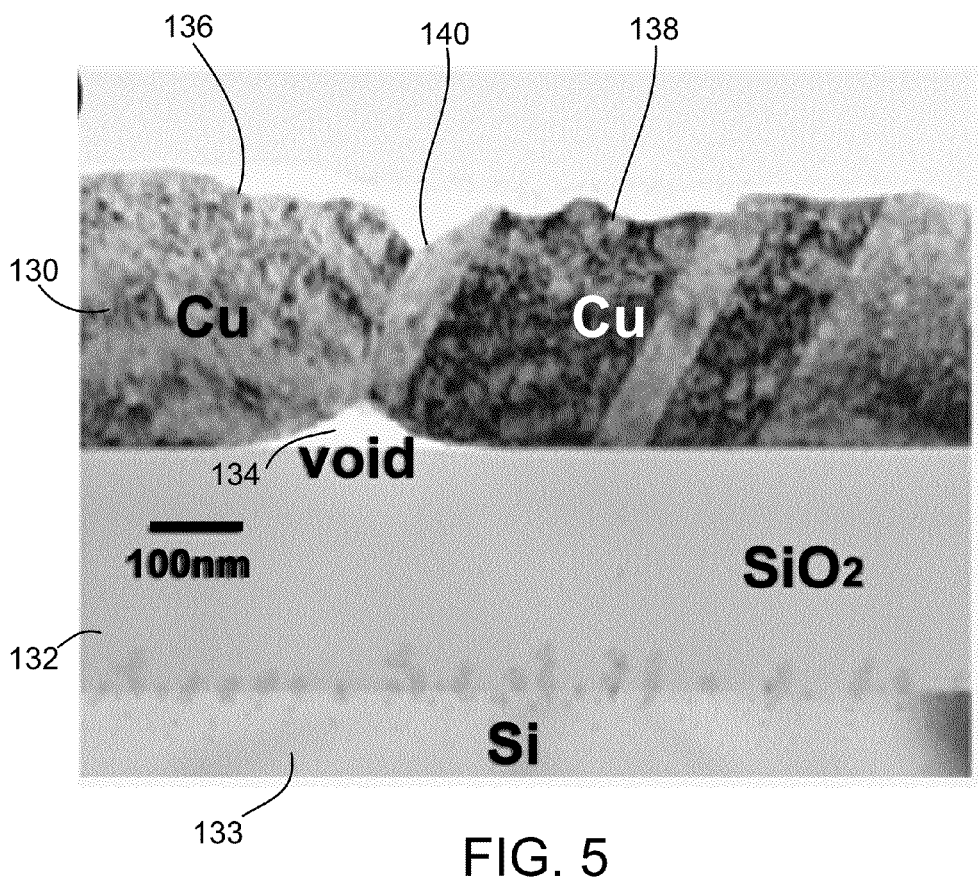
FIG. 5 is a cross-sectional image of a copper thin film and a $SiO_2/Si$ substrate after graphene growth.

FIG. 5 shows an image of a cross section of at the interface between a copper thin film 130 and a silicon oxide layer 132, which is formed on a silicon substrate 133. The image was obtained by transmission electron microscopy (TEM) after graphene growth, although the graphene layers are too thin to be visible in the image. A void 134 exists between two copper grains 136, 138. Graphene and excess carbon materials may accumulate at the void 134 during the graphene growth and copper etching processes. Channels (e.g., 140) between copper grains may provide routes by which carbon atoms diffuse through the copper thin film 130.

Figure 6A:
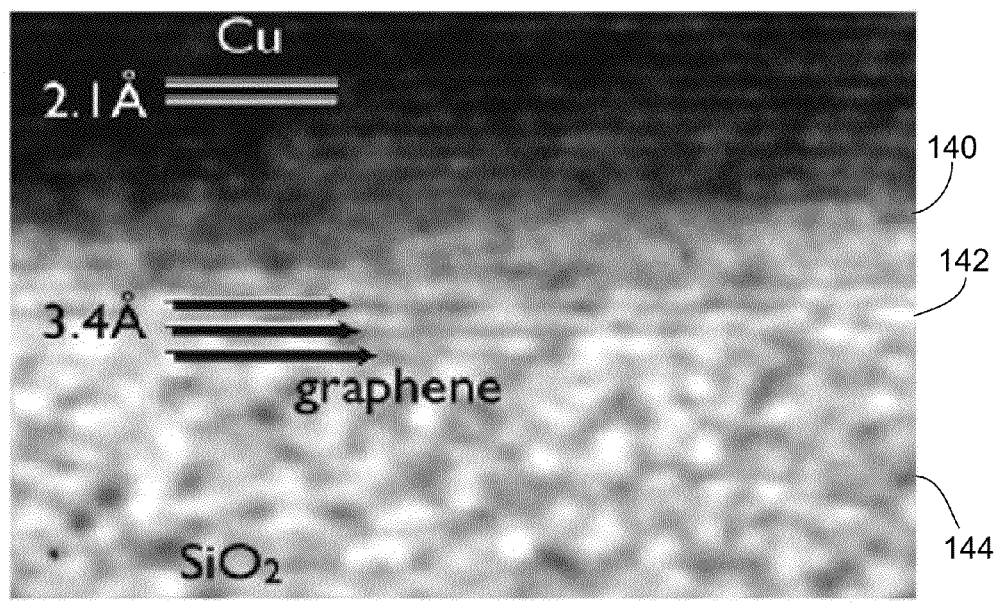
FIGS. 6A and 6B are transmission electron microscopy (TEM) images, each showing the interface region between the copper thin film and the substrate.
Figure 6B:
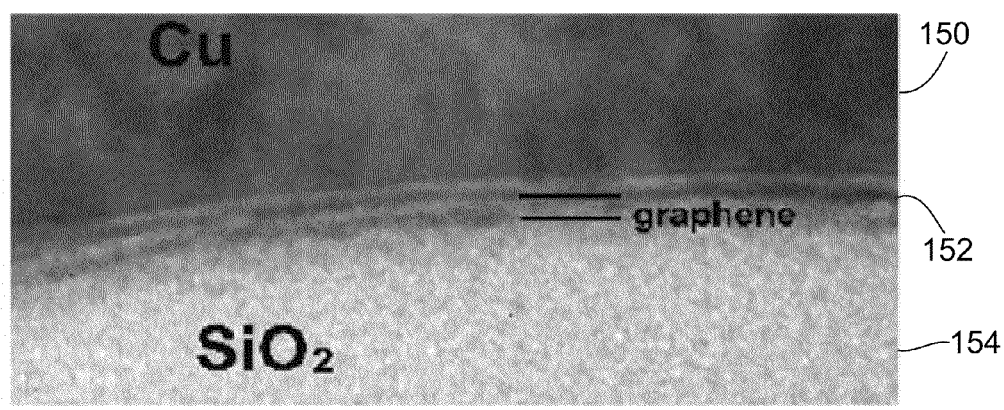

FIG. 6A is a TEM image showing a copper thin film 140, three graphene layers 142, and a silicon oxide layer 144. FIG. 6B is a TEM image showing a copper thin film 150, two graphene layers 152, and a silicon oxide layer 154. These figures clearly indicate the presence of bottom layer graphene at the interface between the copper thin film and the silicon oxide layer.

Figure 7:
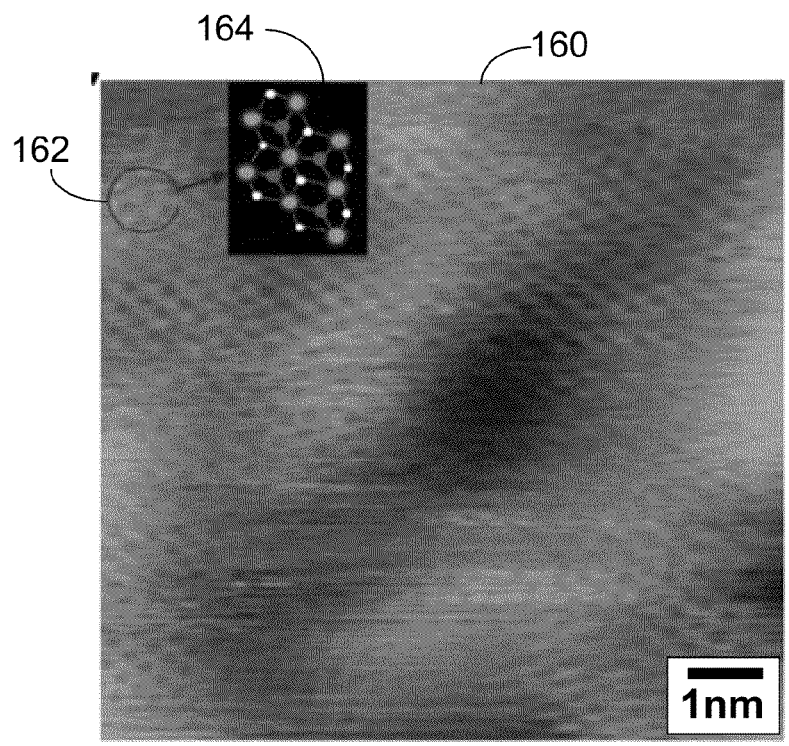
FIG. 7 is a scanning tunneling microscopy (STM) image of an example bottom layer graphene grown on a $SiO_2/Si$ substrate.

FIG. 7 shows a scanning tunneling microscopy (STM) image 160 of bottom layer graphene on a silicon oxide layer. The STM measurement was carried out in a Veeco STM base operated in the constant current mode in ambient condition. Most of the graphene layers have hexagonal carbon lattice structure. Occasionally, A-B stacked (i.e., Bernal stacked) bilayer graphene can be seen in the image, as indicated by a circle 162, in which the schematic atomic configuration is shown in an inset 164. In several portions of the image 160, stacking configurations other than A-B stacking can be seen.

Figure 8:
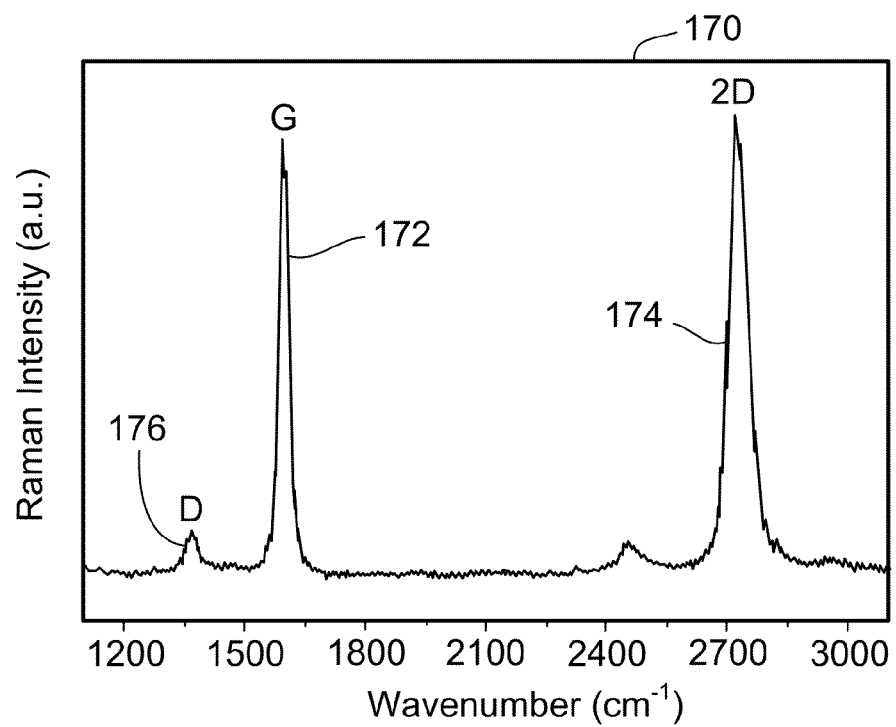
FIG. 8 is a graph showing an example Raman spectrum of a bottom layer graphene.

FIG. 8 is a graph 170 showing an example Raman spectrum for the bottom layer graphene, in which the graphene layers were excited by 473 nm laser. The Raman spectrum for the graphene layers shows an intense G band 172 at around 1590 $cm^{-1}$ and a sharp 2D band 174 at around 2720 $cm^{-1}$, suggesting that the bottom layer graphene is highly graphitized, which is consistent with the STM measurements shown in FIG. 7. The Raman spectrum also includes a weak D band 176.

Figure 9:
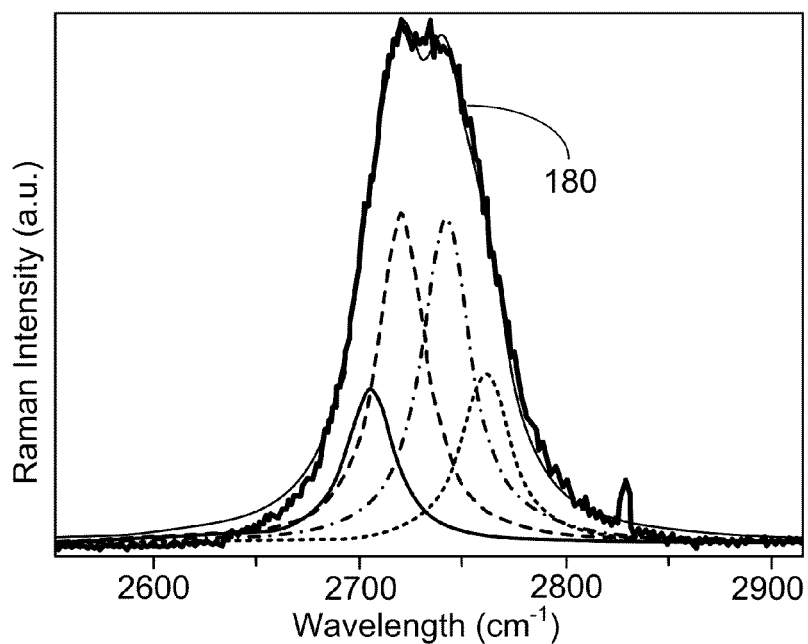
FIG. 9 is a graph showing a 2D peak in the Raman spectrum of the bottom layer graphene.

FIG. 9 shows the 2D peak 180 in the Raman spectrum for the bottom layer graphene. In some examples, the Raman 2D peak obtained at different sites of the bottom layer graphene can be de-convoluted into four 2D sub-bands, which may indicate the presence of A-B stacked graphene layer.

Figure 10:
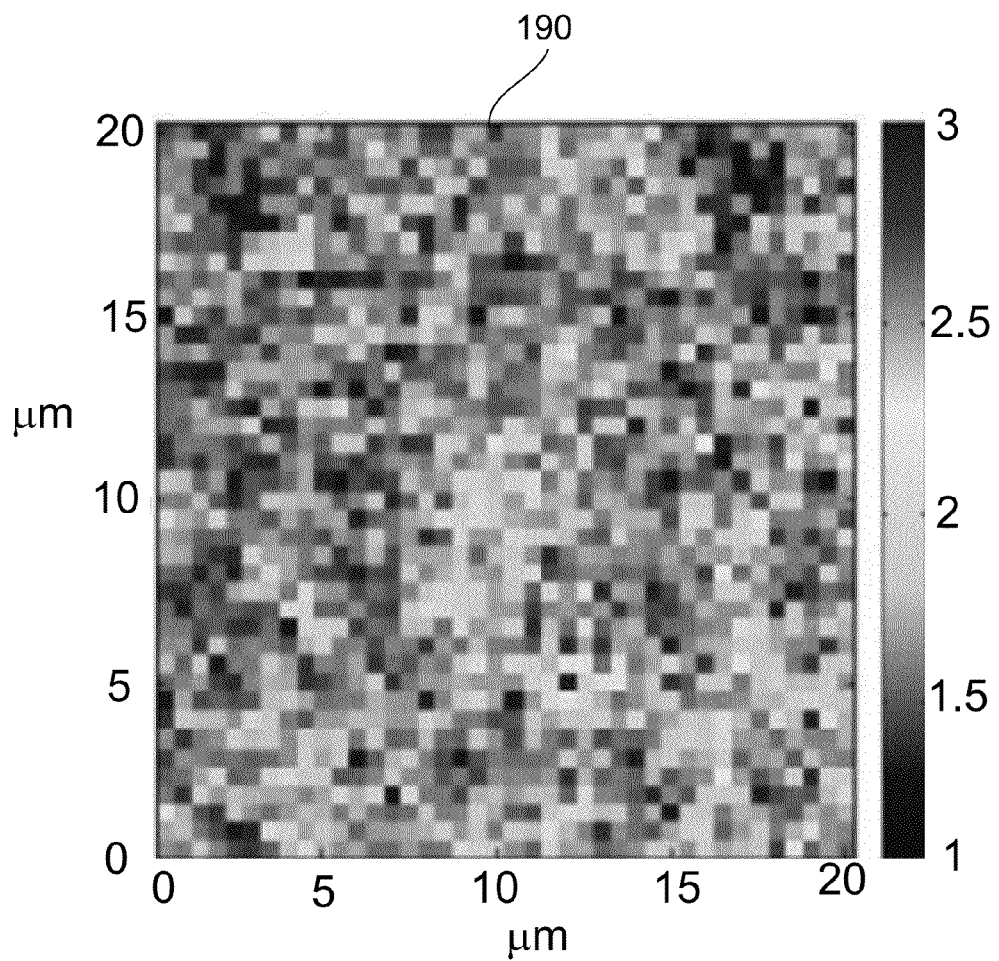
FIG. 10 is a Raman map representing an example distribution of the intensity ratios of 2D and G bands, I(2D)/I(G).

FIG. 10 shows a Raman map 190 constructed by plotting the intensity ratios of 2D and G bands, I(2D)/I(G), which indicate the number of layers of graphene fabricated using chemical vapor deposition. The Raman I(2D)/I(G) mapping indicates that the bottom layer graphene is thin and continuous, likely ranging from two to three layers.

Figure 11:
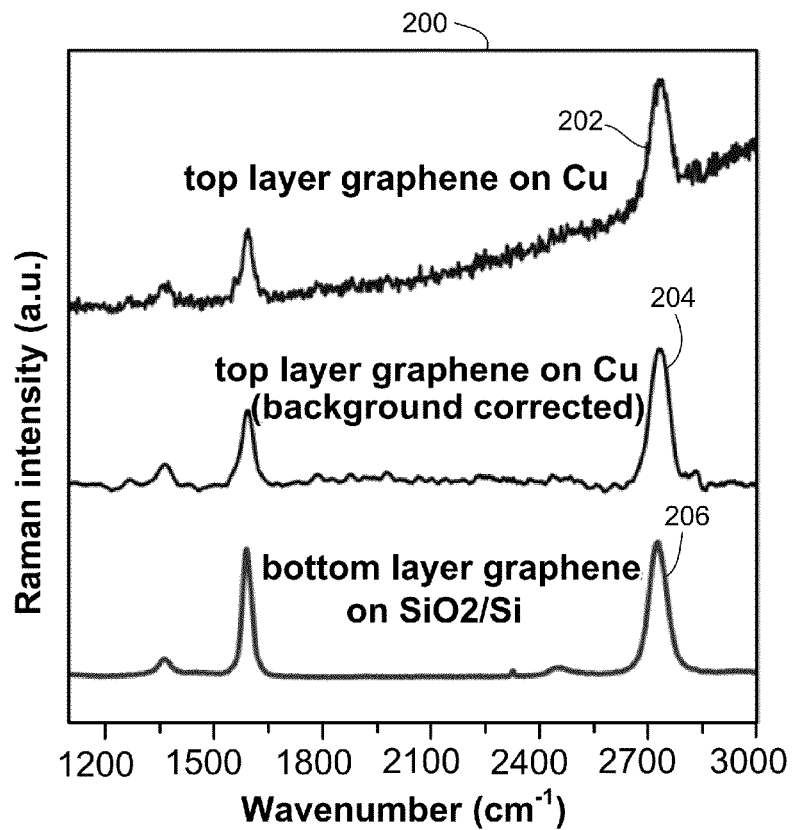
FIG. 11 is a graph showing a comparison of the Raman spectra for various types of graphene layers.

FIG. 11 is a graph 200 showing a comparison of a Raman spectrum for a top layer graphene 202, a Raman spectrum for a top layer graphene with background corrected 204, and a Raman spectrum for a bottom layer graphene 206 obtained from the process 100 described above. The Raman spectra for both the top layer graphene and the bottom layer graphene show a small D band.

Figure 12:
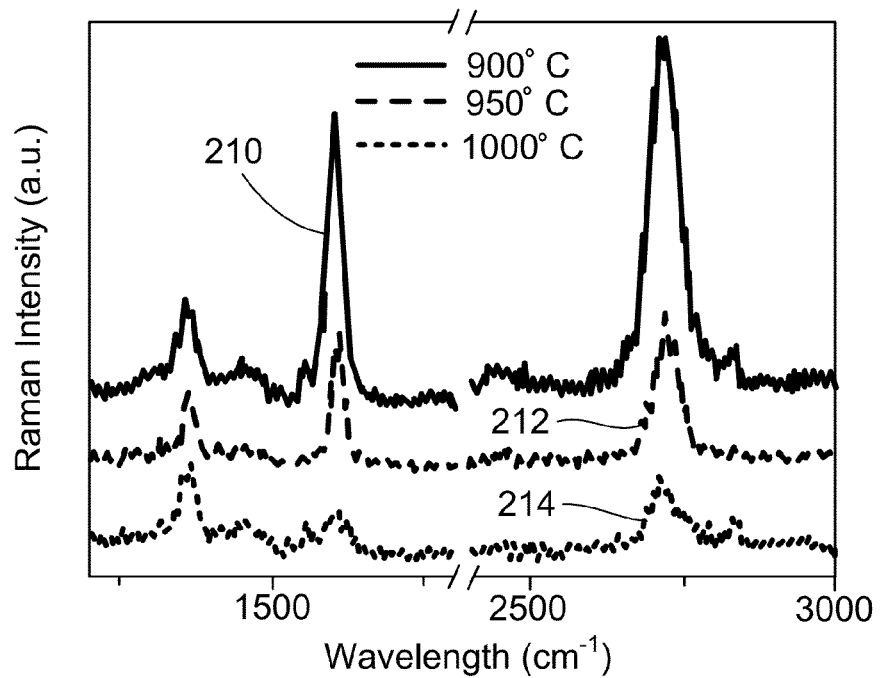
FIG. 12 is a graph showing the Raman spectra of graphene layers grown under different temperatures.

FIG. 12 shows the Raman spectra of graphene layers obtained under various temperatures. Curves 210, 212, and 214 represent the Raman spectra of graphene layers grown at 900° C., 950° C., and 1000° C., respectively. The Raman spectrum of the graphene layers grown at 900° C. shows more significant peaks, indicating that 900° C. is better for growing graphene layers than 950° C. or 1000° C. when the other parameters are the same.

When a lower growth temperature (e.g., 850° C.) is used, it may be difficult to form continuous graphene layers under the copper thin film, and the D band in the Raman spectrum may be high. This is likely due to poor graphitization at low temperature. When the growth temperature is higher than 950° C., the defect level of the graphene layers is also high. This may be due to the segregation of carbon species at the copper-silicon oxide interface being faster than the graphitization process.

Figure 13:
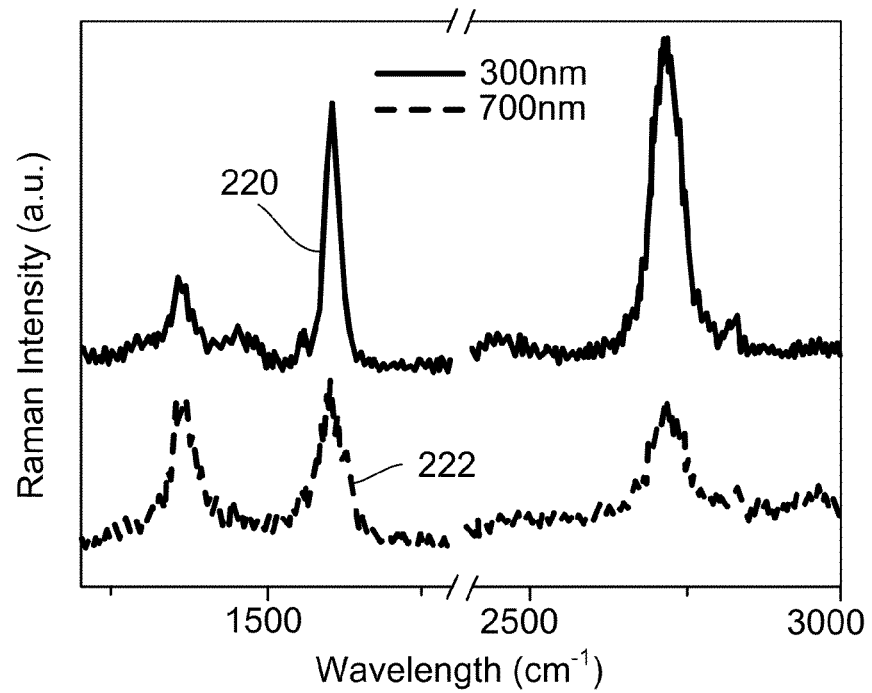
FIG. 13 is a graph showing the Raman spectra of graphene layers grown on copper thin films of different thicknesses.

FIG. 13 shows the Raman spectra of graphene layers grown on copper thin films of various thicknesses. A curve 220 represent the Raman spectrum of graphene layers obtained using a copper thin film having a thickness of 300 nm, and a curve 222 represents the Raman spectrum of graphene layers obtained using a copper thin film having a thickness of 700 nm. The Raman spectrum of the graphene layers grown using the 300 nm copper thin film shows more significant peaks, indicating that the 300 nm copper thin film is better for growing graphene layers, compared to the 300 nm copper thin film.

Figure 14:
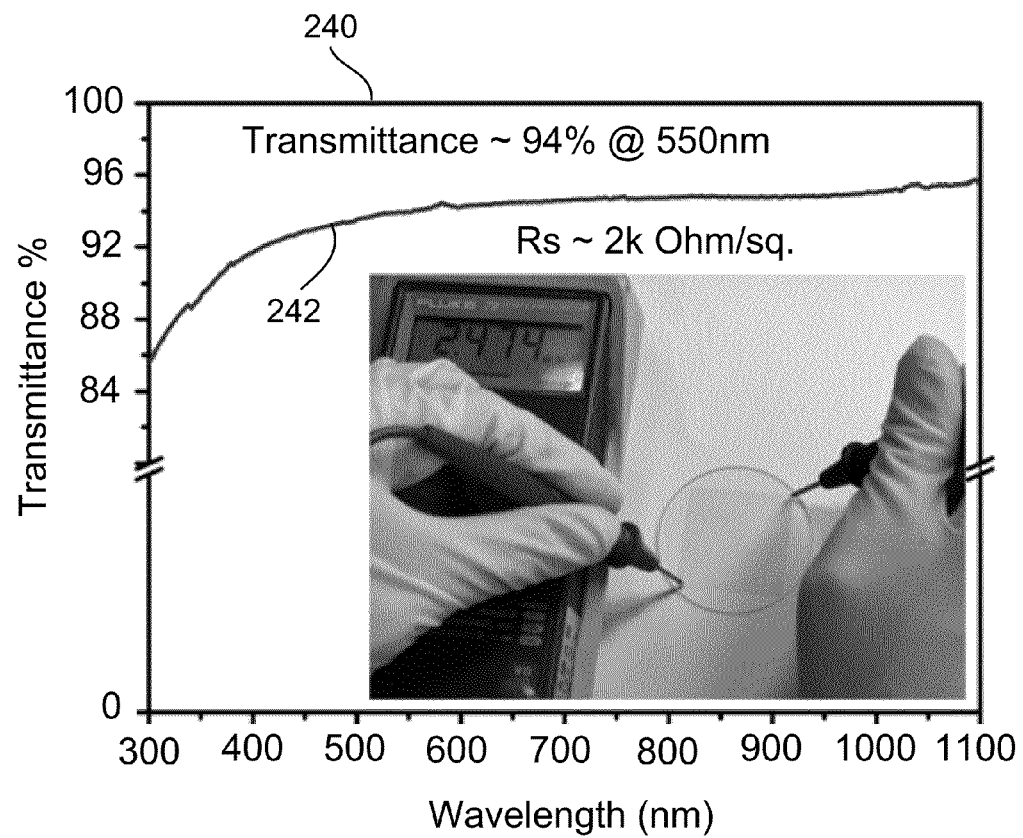
FIG. 14 is a graph showing a transmittance spectrum of a bottom layer graphene grown on a quartz substrate.

FIG. 14 is a graph 240 showing a curve 242 representing the transmittance spectrum of bottom layer graphene grown on a quartz substrate using the process 100 described above. One graphene layer (having a monolayer of carbons) absorbs about 2.3% of light. The bottom layer graphene in FIG. 14 absorbs about 5.2% of light, which suggests that the graphene film has, on average, two graphene layers. The inset shows that the wafer scale bottom layer graphene film is conductive, and the sheet resistance (Rs) for the bottom layer graphene is about 2 kΩ/sq.

To evaluate the electrical performance of the graphene layers, the bottom layer graphene on $SiO_2$/Si was patterned into a strip having a width of about 10 μm using conventional photolithography. A bottom-gate operated transistor was fabricated by forming gold electrodes on top of the patterned graphene.

Figure 15:
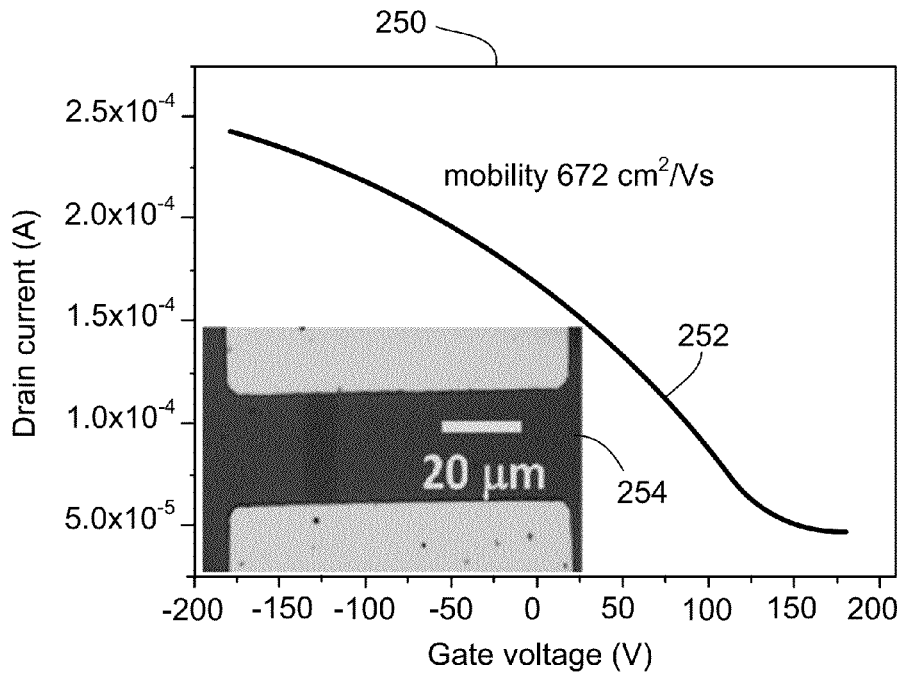
FIG. 15 is a graph showing a transfer curve for a bottom-gate operated transistor.

FIG. 15 is a graph 250 showing a transfer curve 252 (drain current Id versus gate voltage Vg) for the bottom-gate operated transistor 254, shown in the inset. The effective field-effect mobility of holes was calculated to be 672 $cm^2$/V·s in room temperature. This value was determined based on the slope $\Delta Id/\Delta Vg$ fitted to the linear portion of the transfer curve using the equation $\mu=(L/W \cdot C_{ox} \cdot V_d)-(\Delta I_d/\Delta V_g)$. The parameters L and W are the channel length and width, respectively, and $C_{ox}$ is the gate capacitance.

For most of the bottom-gate operated transistors having graphene film grown using the process 100 described above, the neutrality point (the valley point of the transfer curve) is beyond 100V, suggesting that the graphene layers are heavily p-doped. P-doping of graphene in ambient can be explained by intrinsic graphene screening of charges at the graphene/$SiO_2$ substrate interface. Thermal annealing may induce a pronounced distortion in the graphene layers on the silicon oxide layer. This structural deformation is closely coupled to the silicon dioxide at room temperature. When exposed to the atmosphere, the structural deformation promotes hole doping caused by ambient oxygen and moisture. Because the graphene layers were directly grown on the silicon oxide layer at 900° C., the heavy p-doping is not unexpected.

Figure 16:
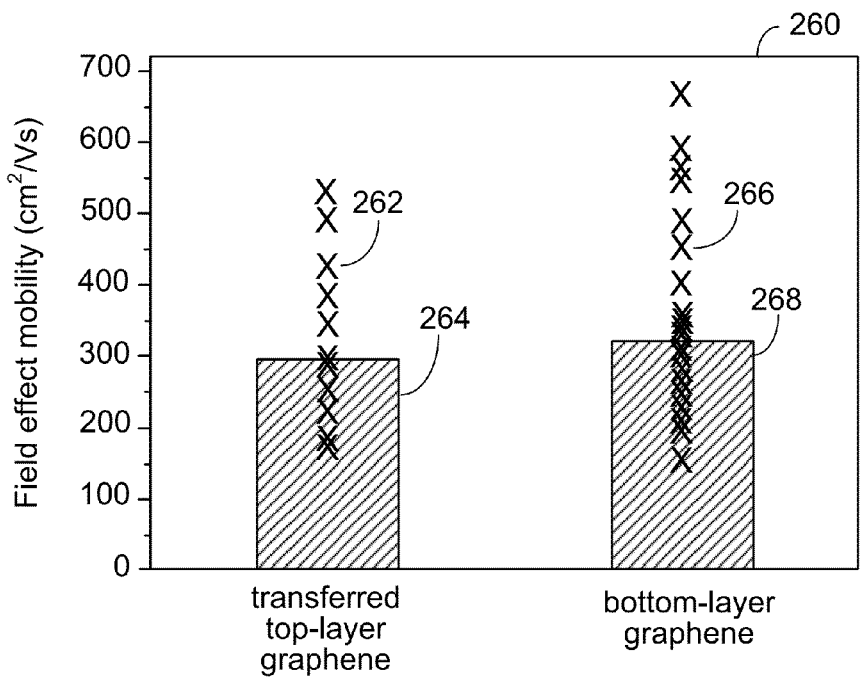
FIG. 16 is a graph showing statistical results of field effect mobility for transistors made from top layer graphene and bottom layer graphene.

FIG. 16 is a graph 260 showing the statistical results of field-effect mobility for transistors made from top layer graphene and bottom layer graphene. For the top layer graphene, the process conditions were optimized for growing a single-layer graphene on the top surface of the copper thin film. The single-layer graphene was transferred to a $SiO_2$/Si substrate, and subsequently processed to fabricate a transistor incorporating the graphene layer. The bottom layer graphene was grown using the process conditions described above. The "X" marks 262 represent measurements of field effect mobility for 17 transistors made from top layer graphene. The bar 264 shows the average value of the 17 measurements. The "X" marks 266 represent measurements of field effect mobility for 35 transistors made from bottom layer graphene. The bar 268 shows the average value of the 35 measurements. The measurements show that the field effect mobility for the single-layered top graphene and the few-layered bottom graphene are roughly comparable. The variations in mobility values shown in the figure may be caused by factors such as photoresist residues, metal contacts, and the etching processes.

Figure 17:
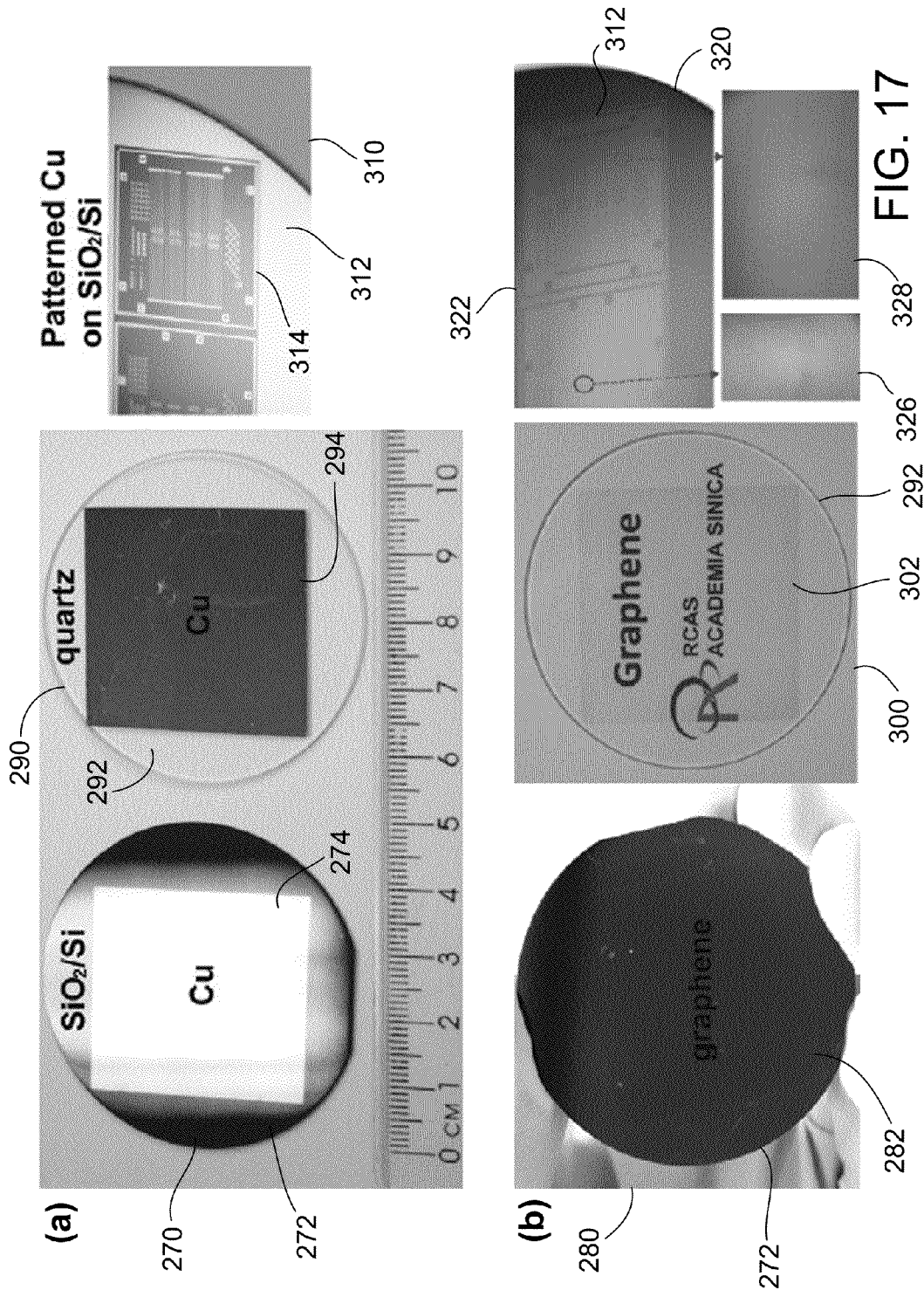
FIG. 17 shows images of various types of substrates and graphene layers.

FIG. 17 shows images of samples having various types of substrates and graphene layers grown on the substrates. A sample 270 includes a 2-inch silicon wafer 272 that has a silicon oxide layer above the silicon substrate, in which a square-shaped 300 nm copper thin film 274 was formed on the silicon oxide layer. A sample 280 includes the silicon wafer 272 with bottom layer graphene 282 grown on the silicon oxide layer.

A sample 290 includes a quartz substrate 292 having a copper thin film 294. A sample 300 includes the quartz substrate 292 with bottom layer graphene 302 grown on the quartz substrate.

A sample 310 includes a silicon wafer 312 having a silicon oxide layer, in which a patterned 300 nm copper layer was formed on the silicon oxide layer. A sample 320 includes the silicon wafer 312 with patterned bottom layer graphene 322 grown on the silicon oxide layer.

The samples 280, 300, and 320 were obtained after removing the top layer graphene by oxygen plasma (using 60 W power for 6 minutes) and removing the copper thin films by $Fe(NO_3)_3$ wet etching. The samples 280, 300, and 320 demonstrate that the graphene growth process 100 can be used to directly grow large-area and continuous thin graphene layers on top of various insulating substrates. The sample 320 shows that patterned bottom layer graphene can be obtained if patterned copper films are used.

Figure 18:
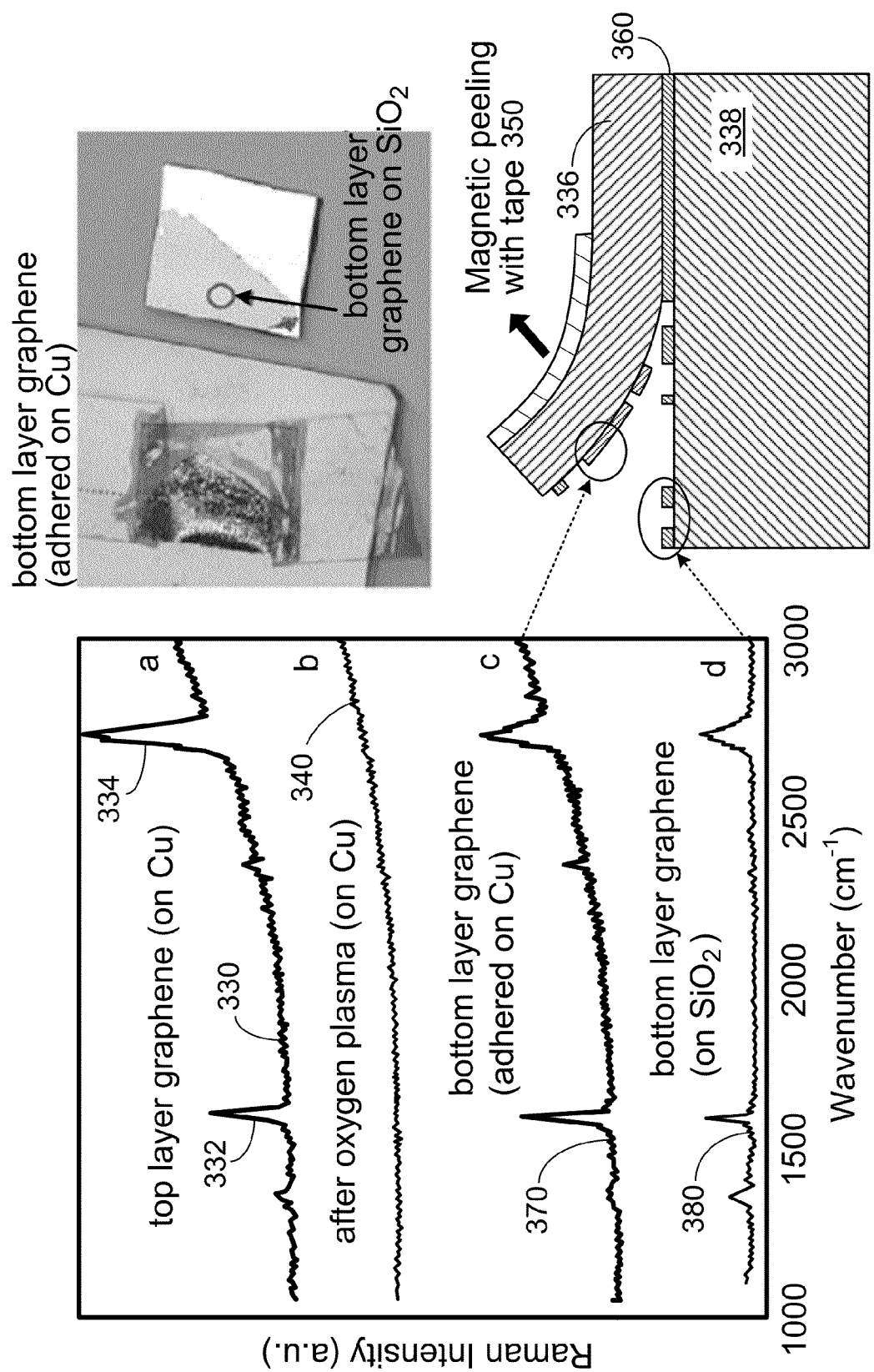
FIG. 18 shows the Raman spectra of various layers.

Raman measurements were performed to confirm the existence of the bottom layer graphene 282, 302, and 322. FIG. 18 shows a curve 330 that represents the Raman spectrum of a $SiO_2$/Si substrate 338 having top layer graphene on a copper thin film 336. The Raman spectrum 330 includes a G band 332 (about 1598 $cm^{-1}$) and a 2D band 334 (about 2712 $cm^{-1}$). A curve 340 represents the Raman spectrum of the sample after the sample is treated with oxygen plasma, which removes the top layer graphene. The curve 340 does not appear to have Raman features for graphene, indicating that the top layer graphene was totally removed after oxygen plasma treatment.

The presence of the bottom layer graphene 360 may weaken the interfacial adhesion between the copper thin film 336 and the underlying silicon oxide layer 338, so mechanical peeling 350 of the copper thin film 336 can be performed using adhesive tapes. When the copper thin film 336 is lifted by mechanical peeling 350, part of the bottom layer graphene 360 is lifted by the copper thin film 336, while the remaining bottom layer graphene 360 stays on the silicon oxide layer 338.

A curve 370 represents the Raman spectrum of the bottom layer graphene 360 adhered to the copper thin film 336. A curve 380 represents the Raman spectrum of the bottom layer graphene 360 adhered to the silicon oxide layer 338. These measurements confirm the formation of graphene layers at the interface between the copper thin film 336 and the silicon oxide layer 338.

Figure 19:
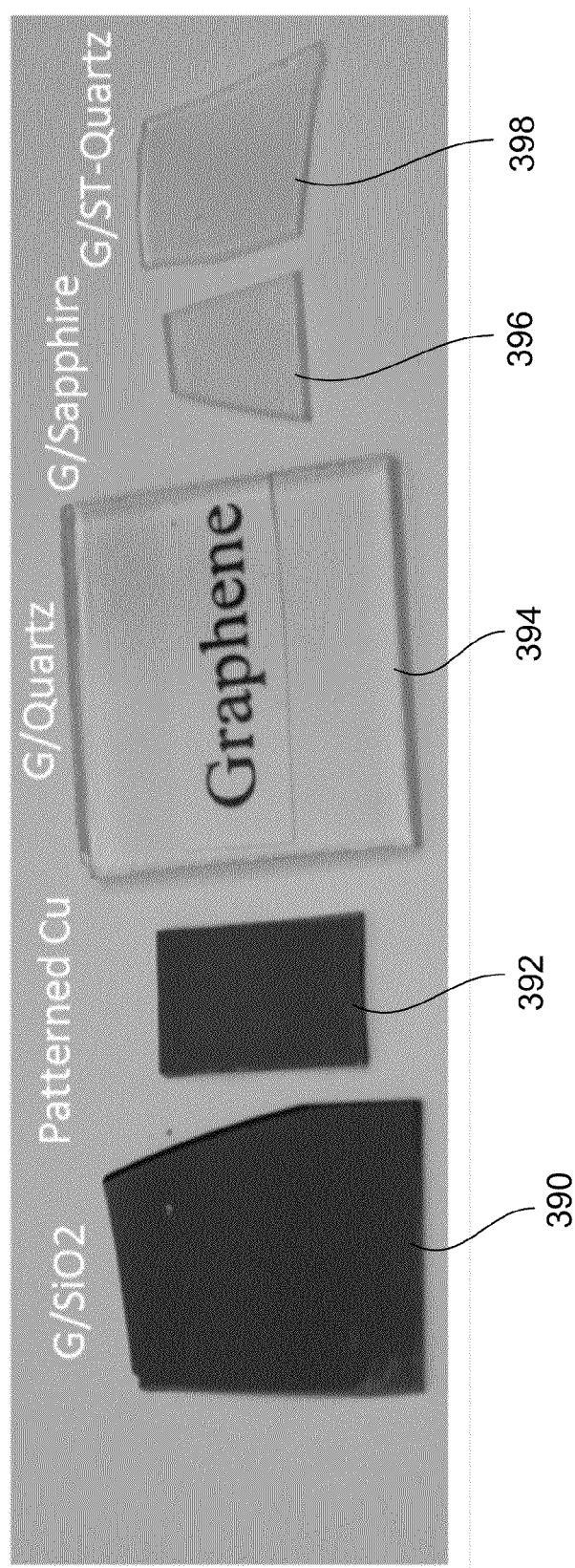
FIG. 19 is a photo showing graphene layers grown on various types of substrates.

FIG. 19 is a photo showing graphene layers grown on various types of insulator substrates. For example, the substrates can be $SiO_2$/Si substrates 390 and 392, a quartz substrate 394, a sapphire substrate 396, or a ST-cut quartz substrate 398. Patterns were formed on the graphene layers on the $SiO_2$/Si substrate 394 by using patterned copper thin film.

Figure 20:
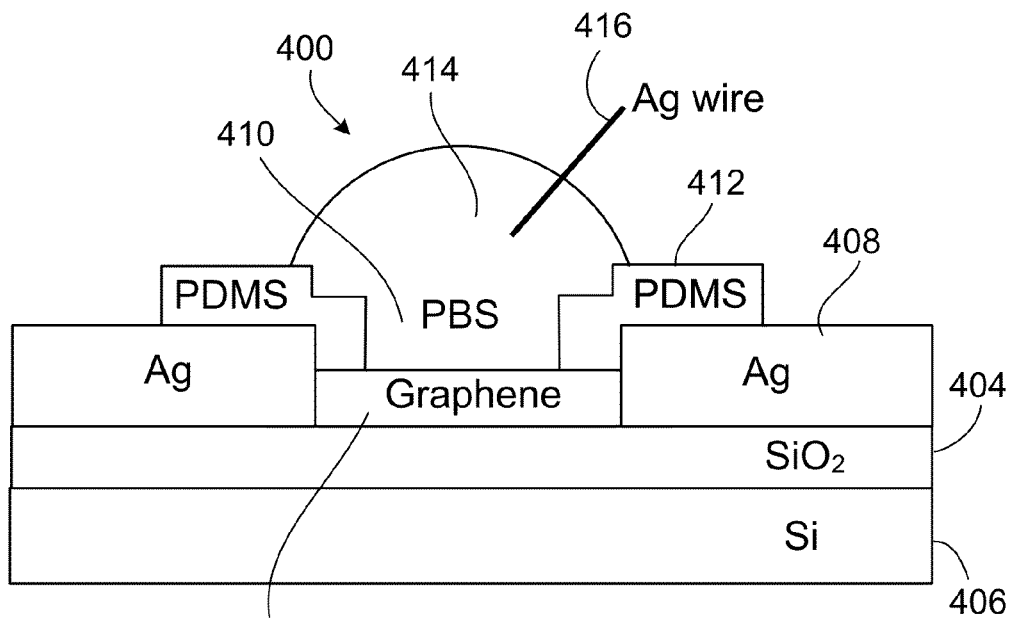
FIG. 20 is a schematic diagram of an example liquid-gated graphene transistor for bio-sensing.

FIG. 20 is a schematic diagram of an example liquid-gated graphene transistor 400 for bio-sensing. A graphene layer 402 is grown on a silicon oxide layer 404 that is formed on a silicon substrate 406. Silver electrodes 408 serving as source and drain electrodes are formed on two ends of the graphene layer 402. A reservoir or cell 410 defined by a polydimethylsiloxane (PDMS) 412 layer is formed to hold a droplet 414 above the graphene layer 402. The droplet 414 contains samples to be analyzed by the graphene transistor 400. A silver wire 416 serves as the gate electrode.

Figure 21:
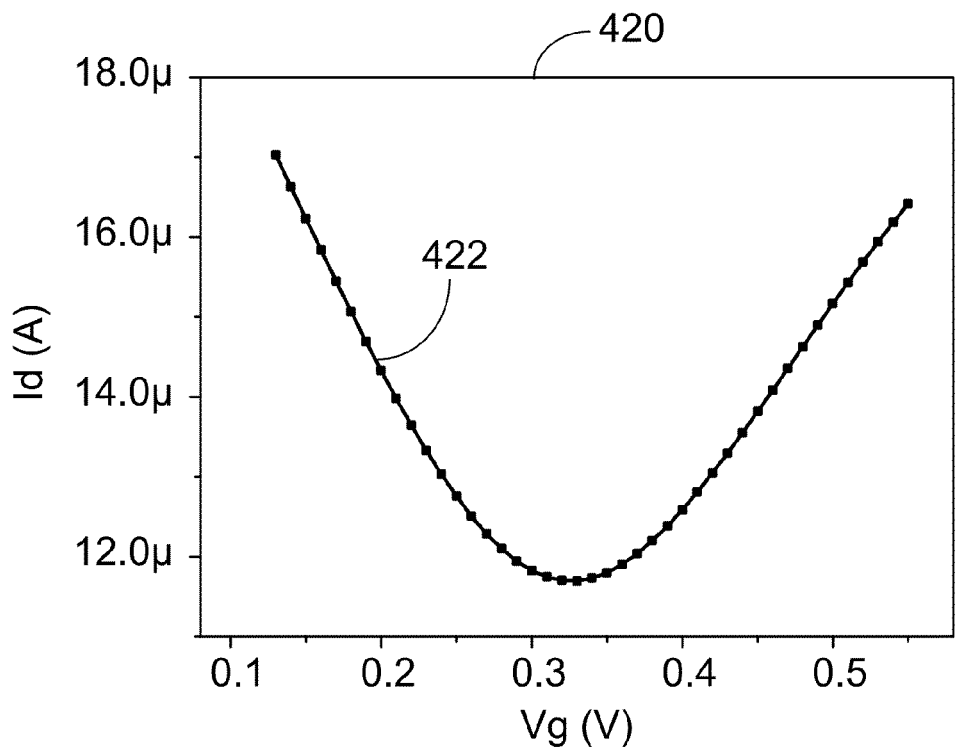
FIG. 21 is a graph showing a transfer function of the liquid-gated graphene transistor.

FIG. 21 is a graph 420 showing a curve 422 representing a transfer function of the liquid-gated graphene transistor 400. The transfer function represents a relationship between the gate voltage (Vg) applied to the silver wire 416 and the current (Id) passing through the drain and source nodes.

In some implementations, the graphene transistor 400 is part of a microfluidic device used to analyze blood samples. For example, the graphene transistor 400 can be used to measure properties of deoxyribonucleic acid (DNA) contained in the blood samples. The reservoir or cell 410 may be connected to fluidic channels in the microfluidic device.

An advantage of the graphene transistor 400 is that the graphene layers 402 are grown directly on the silicon oxide layer 404, so the adhesion between the graphene layers 402 and the silicon oxide layer 404 is stronger than if the graphene layers 402 were grown on another substrate and transferred to the silicon oxide layer 404. In some procedures, the droplet 414 may be heated (for example, to cause DNA denature). The high temperature may cause the graphene layer to peel off from the silicon oxide layer 404 if the adhesion between the graphene layer and the silicon oxide layer is weak (as may be the case for graphene layers that are transferred to the silicon oxide layer).

When the droplet 414 contains different sample molecules (e.g., bio-agents), the transfer function of the graphene transistor 400 may be different due to interactions between the sample molecules and the graphene layers 402. Thus, by measuring the transfer function of the graphene transistor 400, it may be possible to detect changes in the droplet 414 or detect particular types of bio-agents in the droplet 414. Graphene transistors can also be used in, e.g., pH sensors and metal-ions detectors (which is useful for monitoring water purity).

The following describes example processes for fabricating graphene layers and devices that include graphene layers.

Figure 22:
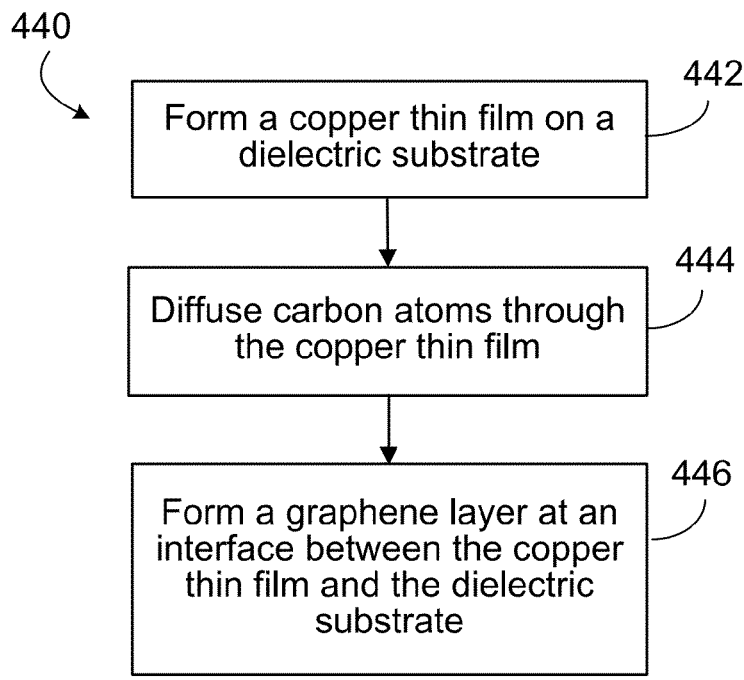
FIG. 22 is a flow diagram of an example process for forming graphene layers on a dielectric substrate.

Referring to FIG. 22, an example process 440 for forming graphene layers on a dielectric substrate includes forming a copper thin film on a dielectric substrate 442, diffusing carbon atoms through the copper thin film 444, and forming a graphene layer at an interface between the copper thin film and the dielectric substrate 446.

The process 440 can further include removing graphene layers formed on the top surface of the copper thin film, and removing the copper thin film to expose the graphene layers on the dielectric substrate. For example, the dielectric substrate can be a silicon substrate having a layer of silicon oxide, a quartz substrate, a sapphire substrate, a boron nitride substrate, or a glass substrate. The carbon atoms can be provided using a precursor material, e.g., a gaseous material such as ethylene, acetylene, or a mixture of the above. The precursor material can be, e.g., a liquid precursor material such as ethanol, benzene, methanol, or a mixture of two or more of the above. The precursor material can be, e.g., a solid-phase precursor material such as carbon-based polymer, nano-carbon materials (e.g., nanotubes, nano flakes, nanoparticles, or graphene), or a combination of two or more of the above. One or more graphene layers can be formed at the interface between the copper thin film and the dielectric substrate. The graphene layers can have a stacked structure, e.g., forming A-B stacked bilayer graphene.

Figure 23:
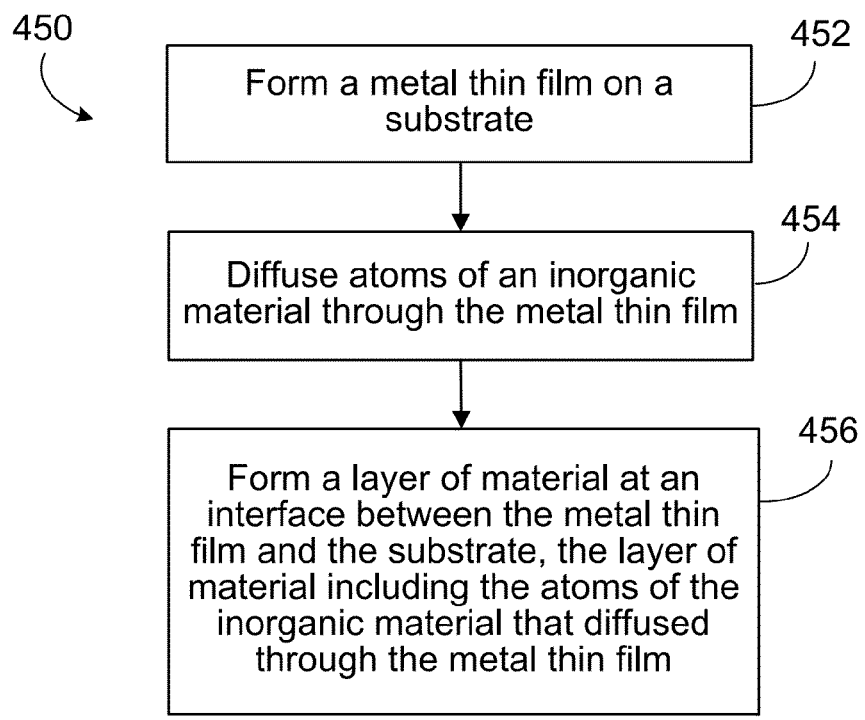
FIG. 23 is a flow diagram of an example process for forming a thin film of inorganic material on a substrate.

Referring to FIG. 23, an example process 450 for forming a thin film of inorganic material on a substrate includes forming a metal thin film on a substrate 452, diffusing atoms of an inorganic material through the metal thin film 454, and forming a layer of material at an interface between the metal thin film and the substrate, the layer of material including the atoms of the inorganic material that diffused through the metal thin film 456.

The process 450 can further include removing the metal thin film to expose the layer of material that includes the atoms of the inorganic material that diffused through the metal thin film. For example, the substrate can be a metal substrate, a dielectric substrate, or a semiconductor substrate. The metal thin film can be made of nickel, iron, cobalt, nickel, gold, silver, or an alloy of two or more of the above. The inorganic material can include carbon or other atoms. The layer of material formed at the interface between the metal thin film and the substrate can have well-defined lattice structures or be amorphous.

Figure 24:
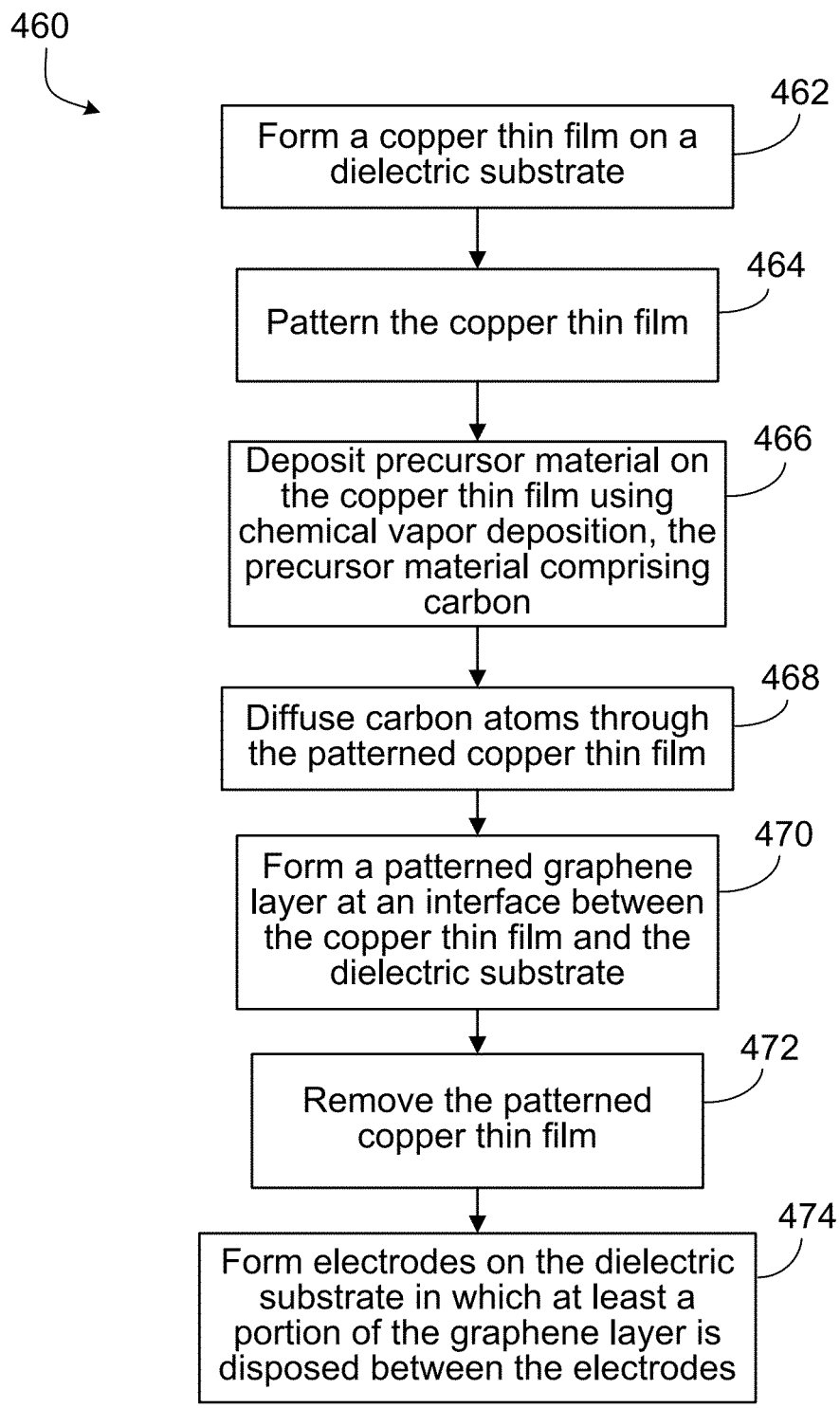
FIG. 24 is a flow diagram of an example process for fabricating a device that includes a graphene layer.

Referring to FIG. 24, an example process 460 is provided for fabricating a device that includes a graphene layer. The process 460 includes forming a copper thin film on a dielectric substrate 462, patterning the copper thin film 464, and depositing precursor material on the copper thin film using chemical vapor deposition, the precursor material including carbon 466. The process 460 further includes diffusing carbon atoms through the patterned copper thin film, forming a patterned graphene layer at an interface between the copper thin film and the dielectric substrate, removing the patterned copper thin film, and forming electrodes on the dielectric substrate in which at least a portion of the graphene layer is disposed between the electrodes.

For example, the copper thin film can be patterned using lithography. The patterns can be designed such that the patterned graphene layer can be made to be part of a graphene transistor. The electrodes can be the source and drain electrodes of the graphene transistor. The device can be used as a bio-sensor.

A number of implementations have been described. Nevertheless, it will be understood that various modifications may be made. For example, elements of one or more implementations may be combined, deleted, modified, or supplemented to form further implementations. Additional steps may be provided, or steps may be eliminated, from the described processes, and other components may be added to, or removed from, the described systems.

For example, the copper thin film 102 can be formed using thermal evaporation or electrochemical deposition. The copper thin film 102 can have a thickness in a range from about 10 nm to about 1 μm, or in a range from about 100 nm to about 300 nm. When a copper thin film is used as a catalyst for graphene formation, the temperature for performing chemical vapor deposition of carbon atoms to the copper surface can be 900° C. or some other temperature. The temperature may vary depending on atmospheric conditions. The substrate 104 can be, e.g., a metal substrate or a semiconductor substrate. The precursor materials can be mixed with other elements, such as nitrogen and/or boron.

The process 100 (FIG. 1) can be modified to fabricate thin films of inorganic materials other than graphene. The precursor material can include particular types of atoms that diffuse through the metal catalyst thin film to form a layer of inorganic material at the interface between the metal thin film and the substrate. The layer of inorganic material can be amorphous. The inorganic material source can include, e.g., boron nitride, molybdenum disulfide, zinc sulfide, zinc telluride, zinc selenide, bismuth selenide ($Bi_2Se_3$), bismuth telluride, or a mixture of two or more of the above.

The chemical vapor deposition used in the process 100 can be replaced by, e.g., physical vapor deposition, epitaxial growth methods, molecular beam epitaxy methods, and atomic layer deposition. When chemical vapor deposition is used, in general the operating temperature can be in a range from about 300° C. to about 1050° C. The proper operating temperature range depends on the selected carbon source or inorganic source of material. For example, when methane is used, the temperature for graphene growth can be in a range from about 700° C. to about 1050° C. When benzene is used, the temperature for graphene growth can be in a range from about 250° C. to about 900° C. The temperature for graphene growth can be reduced when the dissociation of the carbon source is assisted by the application of, e.g., plasma, light, or laser. In the process 100, the copper thin film 102 can be removed by any solution that can etch copper but does not affect the graphene layers. The copper thin film 102 can also be removed by, e.g., electrochemical etching or mechanical removal (such as removal with adhesive tape).

Prior to performing the chemical vapor deposition (or physical vapor deposition, epitaxial growth methods, molecular beam epitaxy methods, atomic layer deposition), pre-processing steps may be used in which the substrate is placed in a hydrogen atmosphere (e.g., in an environment having hydrogen or ammonia) to remove oxygen atoms at the surface of the substrate. The pre-process treatment can control the metal grain size to provide a smooth surface suitable for the growth of graphene layers or thin films made of other inorganic materials. The pre-processing can be performed by, e.g., thermal annealing or hydrogen plasma. The thermal annealing can be performed using a temperature in a range from about 500° C. to about 1100° C., or from about 700° C. to about 1000° C.

Accordingly, other implementations are within the scope of the following claims.

What is claimed is:

1. A method comprising:
   forming a copper thin film on a dielectric substrate;
   depositing a precursor material having carbon atoms on the copper thin film;
   diffusing the carbon atoms through the copper thin film; and
   forming a graphene layer at an interface between the copper thin film and the dielectric substrate;
   wherein for a period of time, depositing the precursor material, diffusing the carbon atoms, and forming the graphene layer are performed concurrently.

2. The method of claim 1 in which the copper thin film is formed using at least one of sputtering, thermal evaporation, or electrochemical deposition.

3. The method of claim 1 in which the copper thin film has a thickness in a range from about 10 nm to about 1 μm.

4. The method of claim 1 in which the copper thin film has a thickness in a range from about 100 nm to about 300 nm.

5. The method of claim 1, comprising depositing a precursor material having carbon atoms on a surface of the copper thin film using chemical vapor deposition.

6. The method of claim 5, comprising performing the chemical vapor deposition at a temperature in a range from about 300° C. to about 1050° C.

7. The method of claim 5, comprising performing the chemical vapor deposition at a temperature in a range from about 800° C. to about 900° C.

8. The method of claim 5, comprising performing the chemical vapor deposition in a hydrogen atmosphere.

9. The method of claim 5 in which the precursor material comprises at least one of methane, ethylene, acetylene, ethanol, benzene, methanol, carbon-based polymer, a nano-carbon material, or a combination of two or more of the above materials.

10. The method of claim 1 in which the dielectric substrate comprises at least one of a silicon substrate, a quartz substrate, a glass substrate, a sapphire substrate, or a boron nitride substrate.

11. The method of claim 1, comprising depositing a precursor material having carbon atoms on a surface of the copper thin film using at least one of physical vapor deposition, atomic layer deposition, epitaxial growth method, or molecular beam epitaxy method.

12. The method of claim 1, comprising removing the copper thin film to expose the graphene layer.

13. The method of claim 12 in which removing the copper thin film comprises using at least one of chemical etching, electrochemical etching, or mechanical removal to remove the copper thin film.

14. The method of claim 12 in which removing the copper thin film comprises using a solution containing $Fe(NO_3)_3$ to etch the copper thin film.

15. The method of 1, comprising forming a bi-layer graphene thin film having two sheets of carbon atoms.

16. The method of 1, comprising forming a tri-layer graphene thin film having three sheets of carbon atoms.

17. The method of claim 1, comprising heating the substrate and the copper thin film in a hydrogen atmosphere to remove an oxide layer from the copper thin film prior to diffusing the carbon atoms.

18. The method of claim 1, comprising fabricating a liquid-gated graphene transistor based on a patterned graphene layer, the liquid-gated graphene transistor comprising a reservoir configured to hold a droplet above the graphene layer.

19. The method of claim 1, comprising forming a graphene thin film having a stacked structure, in which the graphene thin film comprises A-B stacked bilayer graphene.

20. A method comprising:
    forming a metal thin film on a substrate;
    depositing a precursor material having an inorganic material on a first surface of the metal thin film, the first surface facing away from the substrate;
    diffusing atoms of the inorganic material from the first surface through the metal thin film to a second surface of the metal thin film, the second surface facing the substrate;
    forming a layer of material at an interface between the metal thin film and the substrate, the layer of material comprising the atoms of the inorganic material that diffused through the metal thin film; and
    continuously depositing the precursor material on the first surface of the metal thin film, diffusing the atoms of the inorganic material from the first surface to the second surface of the metal thin film, and forming the layer of material for a period of time, such that the diffusion of atoms of the inorganic material and the formation of the layer of material are performed while additional precursor material is being deposited.

21. The method of claim 20, comprising providing a precursor material and causing the precursor material to dissociate at the metal thin surface to produce the atoms that diffuse through the metal thin film.

22. The method of claim 20 in which the metal thin film comprises a copper thin film.

23. The method of claim 20 in which the substrate comprises a dielectric substrate.

24. The method of claim 20 in which the atoms of the inorganic material comprise carbon, and forming a layer of material at an interface comprises forming a graphene layer at the interface.

25. The method of claim 20 in which the metal thin film has a thickness in a range from about 10 nm to about 1 μm.

26. A method comprising:
forming a copper thin film on a dielectric substrate;
patterning the copper thin film;
depositing precursor material on the copper thin film using chemical vapor deposition, the precursor material comprising carbon;
applying plasma to assist dissociation of the precursor material to produce carbon atoms;
diffusing the carbon atoms through the patterned copper thin film;
forming a patterned graphene layer at an interface between the copper thin film and the dielectric substrate while additional precursor material is being deposited on the copper thin film;
removing the patterned copper thin film; and
forming electrodes on the dielectric substrate in which at least a portion of the graphene layer is disposed between the electrodes.

27. The method of claim 5, comprising applying plasma to assist dissociation of the precursor material to produce the carbon atoms.

28. The method of claim 27, comprising patterning the copper thin film, and forming a patterned graphene layer.

29. The method of claim 28, comprising fabricating a transistor based on the patterned graphene layer.

30. The method of claim 1, comprising continuously depositing the precursor material on the first surface of the copper thin film, diffusing the carbon atoms from the first surface to the second surface of the copper thin film, and forming the graphene layer for a period of time, such that the diffusion of carbon atoms and the formation of the graphene layer are performed while additional precursor material is being deposited.

31. The method of claim 1 in which the depositing the precursor material on the first surface of the copper thin film, diffusing the carbon atoms from the first surface to the second surface of the copper thin film, and forming the graphene layer are performed under a same temperature.

32. A method comprising:
forming a copper thin film on a dielectric substrate, the copper thin film having grains of copper;
depositing a precursor material having carbon atoms on a surface of the copper thin film;
diffusing the carbon atoms from the surface of the copper thin film through openings between copper grain boundaries to reach an interface between the copper thin film and the dielectric substrate; and
forming a graphene layer at the interface between the copper thin film and the dielectric substrate;
wherein the precursor material is continuously deposited on the surface of the copper thin film, and the carbon atoms are continuously diffused from the surface of the copper thin film to the interface as the graphene layer is formed at the interface over a period of time.

33. The method of claim 32 in which depositing the precursor material on the surface of the copper thin film, diffusing the carbon atoms from the surface of the copper thin film to the interface, and forming the graphene layer are performed under a same temperature.

34. The method of claim 32, comprising patterning the copper thin film, and forming a patterned graphene layer.

35. The method of claim 34, comprising fabricating a transistor based on the patterned graphene layer.

36. The method of claim 32, comprising depositing the precursor material using chemical vapor deposition at a temperature in a range from about 300° C. to about 1050° C.

* * * * *